US012777643B2

(12) United States Patent
Kim

(10) Patent No.: US 12,777,643 B2
(45) Date of Patent: Oct. 27, 2026

(54) SEMICONDUCTOR DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 699 days.

(21) Appl. No.: 18/117,961

(22) Filed: Mar. 6, 2023

(65) Prior Publication Data

US 2024/0074190 A1 Feb. 29, 2024

(30) Foreign Application Priority Data

Aug. 30, 2022 (KR) ........................ 10-2022-0109232

(51) Int. Cl.

| | |
|---|---|
| ***H10B 43/27*** | (2023.01) |
| ***H10B 41/27*** | (2023.01) |
| ***H10B 41/35*** | (2023.01) |
| ***H10B 41/41*** | (2023.01) |
| ***H10B 43/35*** | (2023.01) |
| ***H10B 43/40*** | (2023.01) |
| ***H10B 63/00*** | (2023.01) |

(52) U.S. Cl.

CPC ............. *H10B 43/27* (2023.02); *H10B 41/27* (2023.02); *H10B 41/35* (2023.02); *H10B 41/41* (2023.02); *H10B 43/35* (2023.02); *H10B 43/40* (2023.02); *H10B 63/34* (2023.02); *H10B 63/845* (2023.02)

(58) Field of Classification Search

CPC ........ H10B 43/27; H10B 41/27; H10B 41/35; H10B 41/41; H10B 43/35; H10B 43/40; H10B 63/34; H10B 63/845; H10B 63/30; H10B 43/10; H10B 43/50

See application file for complete search history.

(56) References Cited

U.S. PATENT DOCUMENTS

| | | | | |
|---|---|---|---|---|
| 2019/0051664 A1* | 2/2019 | Baek | ...................... | H10B 41/27 |
| 2020/0035702 A1* | 1/2020 | Lee | ...................... | H10B 41/10 |
| 2022/0302157 A1* | 9/2022 | Kim | ...................... | H10B 43/27 |
| 2022/0367486 A1* | 11/2022 | Lee | ...................... | H10B 43/10 |

FOREIGN PATENT DOCUMENTS

| | | |
|---|---|---|
| KR | 1020190010403 A | 1/2019 |
| KR | 1020200011852 A | 2/2020 |

* cited by examiner

*Primary Examiner* — Yasser A Abdelaziez
(74) *Attorney, Agent, or Firm* — WILLIAM PARK AND ASSOCIATES LTD.

(57) ABSTRACT

A semiconductor device includes a substrate, a source structure disposed on the substrate, and cell stack structures disposed on the source structure. The semiconductor device also includes a dummy stack structure disposed between the cell stack structures on the source structure and vertical barriers disposed between the dummy stack structure and the cell stack structures. The semiconductor device further includes at least one lower protective pattern disposed at a lower portion of the dummy stack structure between the vertical barriers.

9 Claims, 15 Drawing Sheets

SEMICONDUCTOR DEVICE

CROSS-REFERENCE TO RELATED APPLICATION

The present application claims priority under 35 U.S.C. § 119(a) to Korean patent application number 10-2022-0109232, filed on Aug. 30, 2022, in the Korean Intellectual Property Office, the entire disclosure of which is incorporated herein by reference.

BACKGROUND

1. Technical Field

The present disclosure generally relates to a semiconductor device, and more particularly, to a three-dimensional semiconductor device.

2. Related Art

Nonvolatile memory devices are devices which can electrically erase and program data, and retain stored data even when a supply of power is interrupted. Accordingly, nonvolatile memory devices have recently been widely used in various fields.

Nonvolatile memory devices include various types of memory cell transistors, and are classified as NAND-type or NOR-type according to a cell array structure. The NAND-type nonvolatile memory device has an advantage of high integration, and the NOR-type nonvolatile memory device has an advantage of high speed.

In particular, because the NAND-type nonvolatile memory device has a cell string structure in which a plurality of memory cell transistors are connected in series, the NAND-type nonvolatile memory device provides the advantage of high integration. Also, because the NAND-type nonvolatile memory device adopts an operation method of simultaneously changing data stored in the plurality of memory cell transistors, a speed of updating data is remarkably high as compared with the NOR-type nonvolatile memory device. The NAND-type nonvolatile memory device is mainly used for portable electronic devices which require a mass storage device such as a digital camera or a MP3 player because of the high integration and the high speed of updating data.

Studies for promoting and improving the advantages of the above-described NAND-type nonvolatile memory device have been conducted. As a part of these studies, NAND-type nonvolatile memory devices having three dimensional structures have been proposed.

SUMMARY

Some embodiments are directed to a semiconductor device capable of improved operational reliability.

In accordance with an embodiment of the present disclosure is a semiconductor device including: a substrate; a source structure disposed on the substrate; cell stack structures disposed on the source structure; a dummy stack structure disposed between the cell stack structures on the source structure; vertical barriers disposed between the dummy stack structure and the cell stack structures; and at least one lower protective pattern disposed at a lower portion of the dummy stack structure between the vertical barriers.

In accordance with another embodiment of the present disclosure is a semiconductor device including: a contact structure; a source structure surrounding the contact structure; a first stack structure disposed on the top of the contact structure and the source structure; at least one lower protective pattern in contact with the source structure and penetrating the first stack structure; and a second stack structure disposed on the top of the lower protective pattern and the first stack structure.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional descriptions disclosed herein are merely illustrative for the purpose of describing embodiments according to the concept of the present disclosure. The embodiments according to the concept of the present disclosure can be implemented in various forms, and should not be construed as being limited to the embodiments set forth herein.

It will be understood that, although the terms "first," "second," etc. may be used herein to describe various elements, these elements should not be limited by these terms. These terms are only used to distinguish one element from another element and are not meant to imply a number or order of elements. Thus, a "first" element discussed below could also be termed a "second" element without departing from the teachings of the present disclosure.

Figure 1:
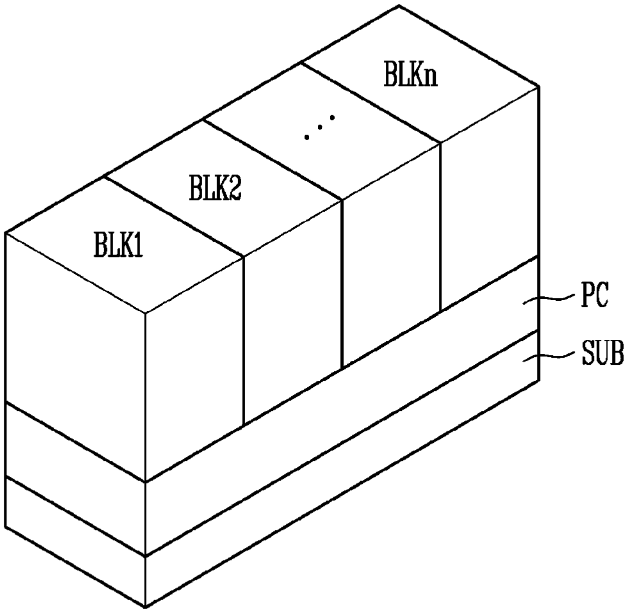
FIG. 1 is a block diagram schematically illustrating a semiconductor device in accordance with an embodiment of the present disclosure.

FIG. 1 is a block diagram schematically illustrating a semiconductor device in accordance with an embodiment of the present disclosure.

Referring to FIG. 1, the semiconductor device may include a peripheral circuit structure PC and memory blocks BLK1 to BLKn, which are disposed on a substrate SUB. The memory blocks BLK1 to BLKn may overlap with the peripheral circuit structure PC.

The substrate SUB may be a single crystalline semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed through a selective epitaxial growth process.

The peripheral circuit structure PC may include a row decoder, a column decoder, a page buffer, and a control circuit. The peripheral circuit structure PC may include NMOS and PMOS transistors, a resistor, and a capacitor, which are electrically connected to the memory blocks BLK1 to BLKn. The peripheral circuit structure PC may be disposed between the substrate SUB and the memory blocks BLK1 to BLKn.

Each of the memory blocks BLK1 to BLKn may include impurity doping regions, bit lines, cell strings electrically connected to the impurity doping regions and the bit lines, word lines electrically connected to the cell strings, and select lines electrically connected to the cell strings. Each of the cell strings may include memory cells and select transistors, which are connected in series by a channel structure. Each of the select lines is used as a gate electrode of a select transistor corresponding thereto, and each of the word lines is used as a gate electrode of a memory cell corresponding thereto.

When the peripheral circuit structure PC is disposed between the substrate SUB and the memory blocks BLK1 to BLKn as described above, a peripheral contact plug which is connected to the peripheral circuit structure PC and extends up to a height at which the memory blocks BLK1 to BLKn are disposed may be disposed in a cell array region in which the memory blocks BLK1 to BLKn are disposed.

Figure 2:
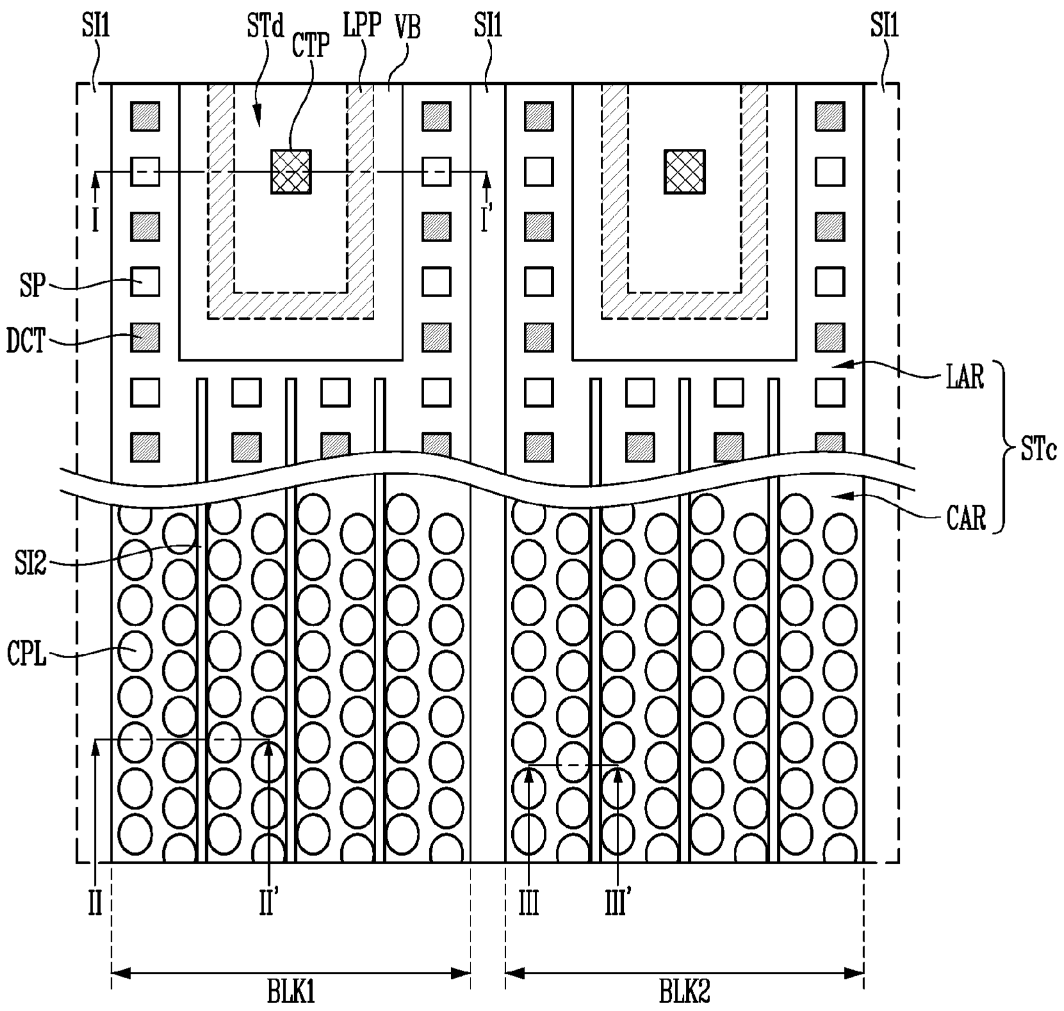
FIG. 2 is a plan view illustrating memory blocks in accordance with an embodiment of the present disclosure.

FIG. 2 is a plan view illustrating memory blocks in accordance with an embodiment of the present disclosure. Specifically, FIG. 2 illustrates a first memory block BLK1 and a second memory block BLK2, which are adjacent to each other.

Referring to FIG. 2, each of the memory blocks BLK1 and BLK2 may include a cell stack structure STc and a dummy stack structure STd, which are stacked on a source structure.

The cell stack structure STc may include a cell array region CAR and a connection region LAR. The cell array region CAR is a region in which cell strings are disposed. The connection region LAR may extend from the cell array region CAR to surround the dummy stack structure STd. The connection region LAR of the cell stack structure STc may extend in parallel to first slits SI1.

The cell array region CAR of the cell stack structure STc may be penetrated by cell plugs CPL. Each of the cell plugs CPL may constitute a cell string corresponding thereto. The cell plugs CPL may be arranged in a matrix structure or be arranged in zigzag pattern between the first slits SI1 adjacent to each other. A top end of the cell stack structure STc in the cell array region CAR of the cell stack structure STc may be penetrated by a second slit SI2. The second slit SI2 may be disposed between the first slits SI1 adjacent to each other.

Each of the memory blocks BLK1 and BLK2 may further include a peripheral contact plug CTP penetrating the dummy stack structure STd, a vertical barrier VB surrounding the dummy stack structure STd, and a lower protective pattern LPP formed between the peripheral contact plug CTP and the vertical barrier VB. Because the lower protective pattern LPP is formed while penetrating a lower portion of the dummy stack structure STd, the lower protective pattern LPP can block an etching material from being introduced toward a region in which the peripheral contact plug CTP is disposed while a process of manufacturing the semiconductor device is performed.

To increase the stability of the process of manufacturing the semiconductor device, support structures may be further formed at the periphery of the dummy stack structure STd. The support structures may be formed in various structures. FIG. 2 illustrates support structures including supports SP, vertical barriers VB, and dummy contacts DCT. In an embodiment, the vertical barriers VB may be formed longer in a horizontal direction than each of the supports SP and the dummy contacts DCT. The supports SP and the vertical barriers VB can block the etching material from being introduced toward the region in which the peripheral contact plug CTP is disposed while the process of manufacturing the semiconductor device is performed.

Figure 3:
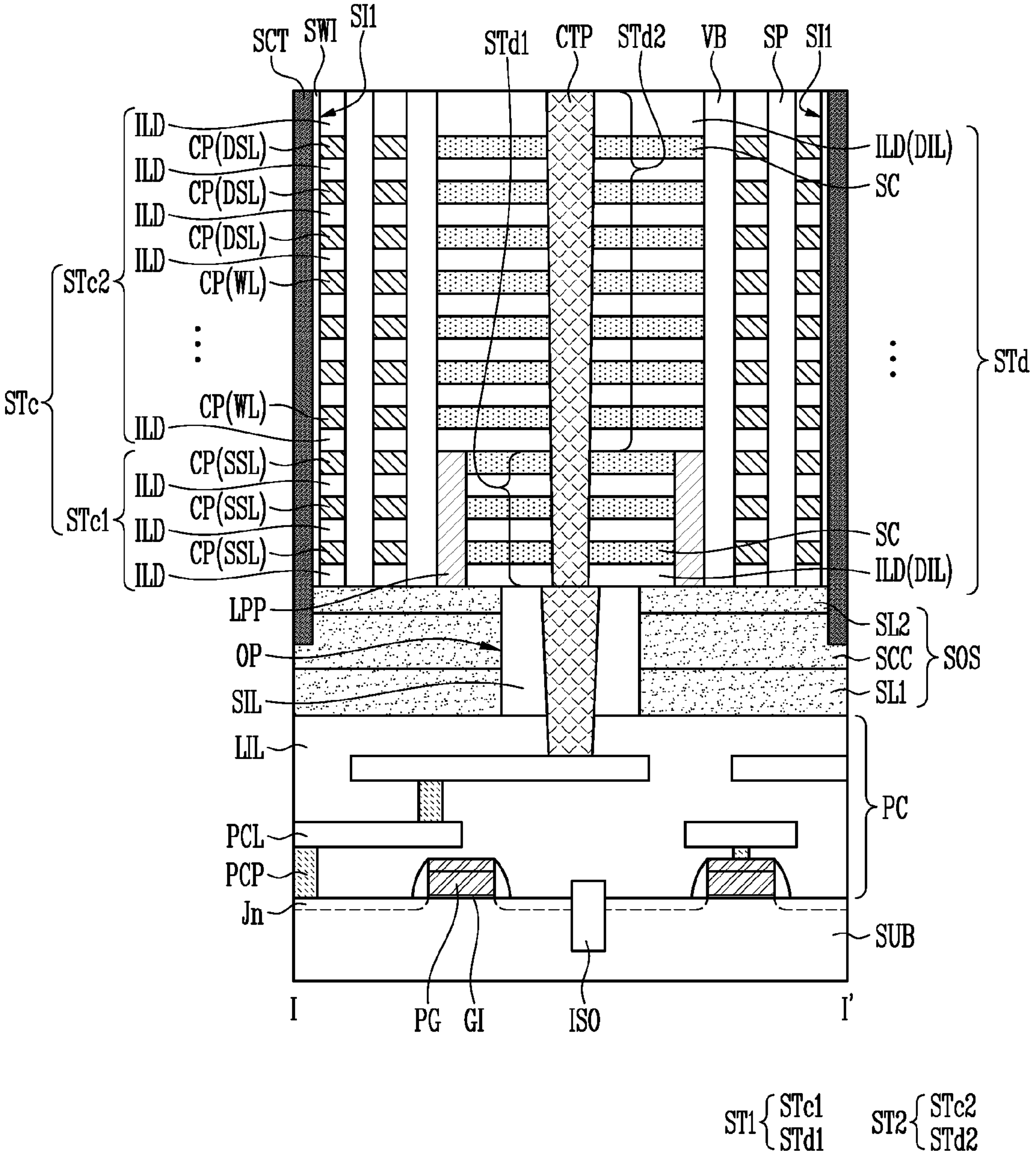
FIG. 3 is a sectional view of a semiconductor device in accordance with an embodiment of the present disclosure.

FIG. 3 is a sectional view of a semiconductor device in accordance with an embodiment of the present disclosure.

Referring to FIG. 3, the peripheral circuit structure PC described with reference to FIG. 1 may be disposed under a source structure SOS and a peripheral contact plug CTP. In other words, the peripheral circuit structure PC may be disposed between a substrate SUB and the source structure SOS.

The substrate SUB may include cell regions doped with an n-type or p-type impurity, and active regions isolated by an isolation layer ISO may be defined in each of the cell regions. The isolation layer ISO may be formed of an insulating material.

The peripheral circuit structure PC may include peripheral gate electrodes PG, a gate insulating layer GI, source and drain junctions in, peripheral circuit lines PCL, lower contact plugs PCP, and a lower insulating layer LIL. The peripheral gate electrodes PG may be respectively used as gate electrodes of NMOS and PMOS transistors. The gate insulating layer GI is disposed between each of the peripheral gate electrodes PG and the substrate SUB. The source and drain junctions in correspond to a region defined by implanting an n-type or p-type impurity into an active region overlapping with each of the peripheral gate electrodes PG, and are disposed at both sides of each of the peripheral gate electrodes PG. The peripheral circuit lines PCL may be electrically connected to a circuit of the peripheral circuit structure PC through the lower contact plugs PCP. The circuit of the peripheral circuit structure PC may include an NMOS transistor, a PMOS transistor, a resistor, and a capacitor as described with reference to FIG. 1. For example, the NMOS transistor may be connected to the peripheral circuit lines PCL through the lower contact plugs PCP.

The lower insulating layer LIL may cover the circuit of the peripheral circuit structure PC, the peripheral circuit lines PCL, and the lower contact plugs PCP. The lower insulating layer LIL may include insulating layers stacked in a multi-layer structure.

The peripheral contact plug CTP may be connected to any one of the peripheral circuit lines PCL while penetrating the lower insulating layer LIL. For example, the peripheral contact plug CTP may penetrate a dummy stack structure STd, and extend to the inside of the lower insulating layer LIL while passing through the inside of an opening OP to be connected to the peripheral circuit line PCL disposed under the opening OP. The peripheral circuit line PCL disposed under the opening OP may be a line electrically connected to the NMOS transistor constituting a block select transistor.

The source structure SOS may include a first source layer SL1, a channel connection layer SCC, and a second source layer SL2. The first source layer SL1 may be disposed on the lower insulating layer LIL. The channel connection layer SCC may be disposed on the first source layer SL1. The second source layer SL2 may be disposed on the channel connection layer SCC.

The source structure SOS may include at least one doped semiconductor layer. For example, the source structure SOS may include an n-type doped semiconductor layer doped with an n-type impurity. Alternatively, the source structure SOS may be formed in a stacked structure of a p-type doped semiconductor layer doped with a p-type impurity and an n-type doped semiconductor layer doped with an n-type impurity. The n-type doped semiconductor layer may be used as a source region of a memory string, and the p-type doped semiconductor layer may be used as a well structure.

The first source layer SL1, the channel connection layer SCC, and the second source layer SL2 of the source structure SOS may be completely penetrated by the opening OP. The opening OP may be buried with a source insulating layer SIL. The source insulating layer SIL may be formed of an insulating material such as an oxide layer.

The second source layer SL2 may be formed of a material which can have a high etch resistance while interlayer insulating layers ILD and sacrificial insulating layers SC are etched. For example, the second source layer SL2 may be formed of a poly-silicon layer. Although an example in which the source structure SOS includes the first source layer SL1, the channel connection layer SCC, and the second source layer SL2 has been illustrated, the present disclosure is not limited thereto.

A cell stack structure STc and the dummy stack structure STd may be disposed on the source structure SOS.

The cell stack structure STc may include a first cell stack structure STc1 and a second cell stack structure STc2. Each of the first cell stack structure STc1 and the second cell stack structure STc2 may include interlayer insulating layers ILD and conductive patterns CP, which are alternately stacked. The second cell stack structure STc2 may be disposed on the first cell stack structure STc1. The interlayer insulating layers ILD of the cell stack structure STc may extend in the horizontal direction to overlap with the opening OP and the source insulating layer SIL. Portions of the interlayer insulating layers ILD extending to overlap with the opening OP and the source insulating layer SIL are defined as dummy interlayer insulating layers DIL.

The dummy stack structure STd may include a first dummy stack structure STd1 and a second dummy stack structure STd2. The dummy stack structure STd may include dummy interlayer insulating layers DIL and sacrificial insulating layers SC disposed between the dummy interlayer insulating layers DIL. In other words, the dummy stack structure STd may include the dummy interlayer insulating layers DIL and the sacrificial insulating layers SC, which are alternately stacked.

The first cell stack structure STc1 and the first dummy stack structure STd1 are defined as a first stack structure ST1. The second cell stack structure STc2 and the second dummy stack structure STd2 are defined as a second stack structure ST2.

Each of the conductive patterns CP may be formed of various conductive materials such as a doped silicon layer, a metal layer, a metal silicide layer, and a barrier layer, and include two or more kinds of conductive materials. For example, each of the conductive patterns CP may include tungsten and a titanium nitride layer (TiN) surrounding a surface of the tungsten. The tungsten is a low resistance metal, and may decrease a resistance of each of the conductive patterns CR The titanium nitride layer TiN is a barrier layer, and may prevent a direct contact between the tungsten and the interlayer insulating layers ILD. The interlayer insulating layers ILD may be formed of an insulating material such as an oxide layer. The sacrificial insulating layers SC may be formed of a material different from the material of the interlayer insulating layers ILD. More specifically, the sacrificial insulating layers SC may be formed of a material having a large etch rate difference from the interlayer insulating layers ILD. For example, the sacrificial insulating layers SC may be formed of a nitride layer.

The conductive patterns CP may be used as source select lines SSL, word lines WL, and drain select lines DSL. The source select lines SSL are used as gate electrodes of source select transistors, the word lines WL are used as gate electrodes of memory cells, and the drain select lines DSL are used as gate electrodes of drain select transistors.

Conductive patterns CP of the first cell stack structure STc1 may be used as the source select lines SSL. FIG. 3 illustrates the first cell stack structure STc1 including three source select lines SSL, but the present disclosure is not limited thereto. For example, only a lowermost conductive pattern of the first cell stack structure STc1 may be used as a source select line, or each of two or more conductive patterns may be used as a source select line.

An uppermost conductive pattern and some conductive patterns consecutively disposed thereunder among conductive patterns CP of the second cell stack structure STc2 may be used as the drain select lines DSL. FIG. 3 illustrates a case where the uppermost conductive pattern of the second cell stack structure STc2 and two conductive patterns consecutively disposed thereunder are used as the drain select lines DSL, but the present disclosure is not limited thereto. For example, only the uppermost conductive pattern of the second cell stack structure STc2 may be used as a drain select line, or each of the uppermost conductive pattern and one conductive pattern thereunder may be used as a drain select line. The other conductive patterns of the second cell stack structure STc2, which are disposed under the conductive patterns used as the drain select lines DSL, may be used as the word lines WL.

A vertical barrier VB may be disposed at a boundary of the cell stack structure STc and the dummy stack structure STd. The vertical barrier VB may penetrate the cell stack structure STc and the dummy stack structure STd. The cell stack structure STc and the dummy stack structure STd may be isolated from each other by the vertical barrier VB.

A lower protective pattern LPP may penetrate the first dummy stack structure STd1. The lower protective pattern LPP may penetrate a lowermost sacrificial insulating layer of the first dummy stack structure STd1. The lower protective pattern LPP may block an etching material from being introduced toward a region in which the peripheral contact plug CTP is disposed while a process of manufacturing the semiconductor device is performed.

The peripheral contact plug CTP may penetrate the dummy interlayer insulating layers DIL and the sacrificial insulating layers SC of the dummy stack structure STd. Also, the peripheral contact plug CTP penetrates the source insulating layer SIL, and extends to the inside of the lower insulating layer LIL to be connected to the peripheral circuit line PCL disposed under the source insulating layer SIL. The source insulating layer SIL and peripheral contact plug CTP penetrating through the source insulating layer SIL may be referred to as a contact structure.

Each of first slits SI1 may be filled with a sidewall insulating layer SWI and a source contact structure SCT. The sidewall insulating layer SWI may extend along a sidewall of the first stack structure ST1 and a sidewall of the second stack structure ST2, which are exposed along a sidewall of each of the first slits SI1. The source contact structure SCT may be insulated from the conductive patterns CP by the sidewall insulating layer SWI. The source contact structure SCT may extend to the inside of the source structure SOS. The source contact structure SCT may be formed of various conductive materials such as a doped silicon layer, a metal layer, a metal silicide layer, and a barrier layer, and include two or more kinds of conductive materials. For example, the source contact structure SCT may be formed in a stacked structure of a doped silicon layer and a metal layer formed on the doped silicon layer. The doped silicon layer may include an n-type dopant, and may be formed of a low resistance metal such as tungsten so as to decrease a resistance.

Figure 4A:
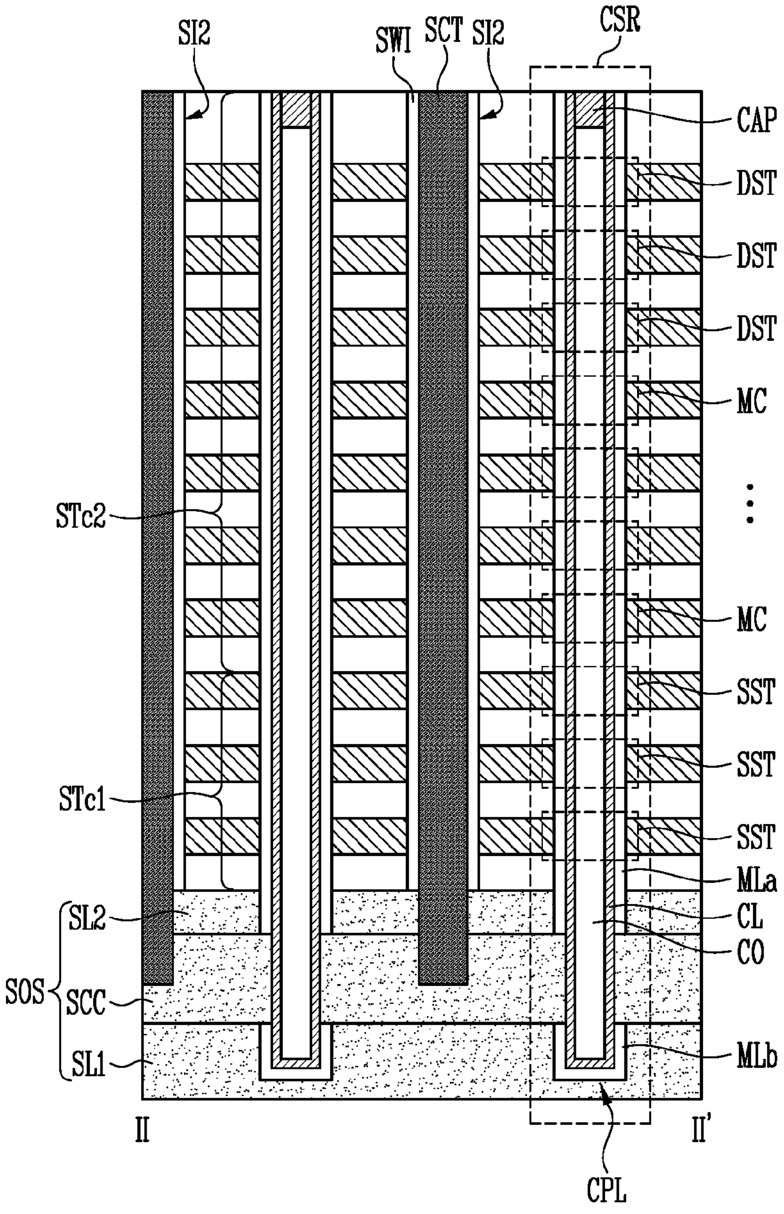
FIGS. 4A and 4B are views respectively illustrating a longitudinal section and a cross-section of a cell plug.
Figure 4B:
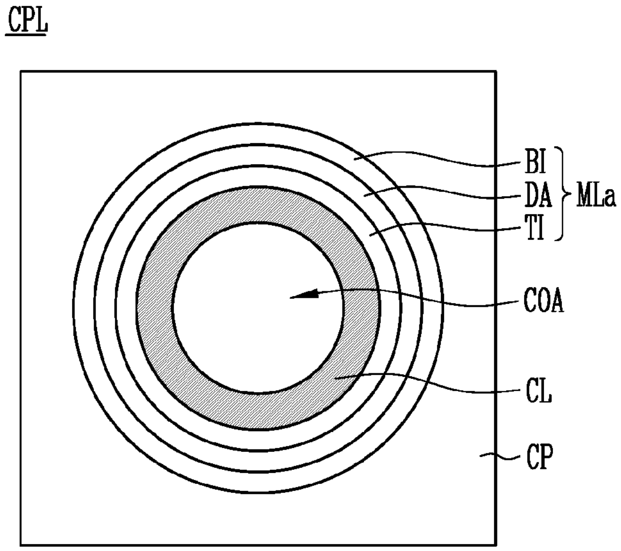

FIGS. 4A and 4B are views respectively illustrating a longitudinal section and a cross-section of a cell plug. More specifically, FIG. 4A is a sectional view taken in a longitudinal direction along line II-II' shown in FIG. 2, and FIG. 4B is a sectional view taken in a cross direction at a height of any one of the word lines WL shown in FIG. 3.

Referring to FIG. 4A, each of cell plugs CPL may include a channel layer CL penetrating the first cell stack structure STc1 and the second cell stack structure STc2 and first and second multi-layer patterns MLa and MLb surrounding the channel layer CL. The channel layer CL may be used as a channel of a cell string CSR. The channel layer CL may be formed of a semiconductor layer. For example, the channel layer CL may be formed of a silicon layer. The channel layer CL may be in direct contact with the channel connection layer SCC.

Each of the cell plugs CPL may further include a core insulating layer CO and a capping pattern CAP, which fill a core region. The core insulating layer CO may be surrounded by the channel layer CL, and the capping pattern CAP may be disposed on the core insulating layer CO. The capping pattern CAP may be formed of a doped semiconductor layer. For example, the capping pattern CAP may be formed of an n-type doped silicon layer. The capping pattern CAP may be used as a drain junction of the cell string CSR.

Each of the cell plugs CPL may extend to the inside of the source structure SOS. More specifically, each of the cell plugs CPL may extend to the inside of the first source layer SL1 while penetrating the second source layer SL2 and the channel connection layer SCC. The channel layer CL may extend to the inside of the first source layer SL1, and have a sidewall in direct contact with the channel connection layer SCC.

The first multi-layer pattern MLa and the second multi-layer pattern MLb may be isolated from each other by channel connection layer SCC in contact with the sidewall of the channel layer CL. Each of the first multi-layer pattern MLa and the second multi-layer pattern MLb may extend along an outer wall of the channel layer CL. More specifically, the first multi-layer pattern MLa may extend between the channel layer CL and the first stack structure ST1 and between the channel layer CL and the second stack structure ST2. The second multi-layer pattern MLb may extend between the channel layer CL and a portion of the first source layer SL1, which is disposed under a contact surface of the channel layer CL and the channel connection layer SCC.

Referring to FIG. 4B, the first multi-layer pattern MLa disposed between the channel layer CL and the conductive pattern CP may include a tunnel insulating layer TI surrounding the channel layer CL, a data storage layer DL surrounding the tunnel insulating layer TI, and a blocking insulating layer BI surrounding the data storage layer DL. The data storage layer DL may store data changed using Fowler-Nordheim tunneling caused by a voltage difference between the word line WL shown in FIG. 3 and the channel layer CL. To this end, the data storage layer DL may be formed of various materials. For example, the data storage layer DL may be formed of a nitride layer in which charges can be trapped. In addition, the data storage layer DL may include silicon, a phase change material, a nano dot, and the like. The blocking insulating layer BI may include an oxide layer capable of blocking charges. The tunnel insulating layer TI may be formed of a silicon oxide layer through which charges can tunnel.

The channel layer CL may be formed in an annular shape defining a core region COA. The core region COA may be completely filled with the channel layer CL, or be filled with at least one of the core insulating layer CO and the capping pattern CAP, which are shown in FIG. 4A.

Referring to FIG. 4A, source select transistors SST may be formed at intersection portions of the conductive patterns of the first cell stack structure STc1 and the channel layer CL. Memory cells MC may be formed at intersection portions of the word lines among the conductive patterns of the second cell stack structure STc2 and the channel layer CL, and drain select transistors DST may be formed at intersection portions of the drain select lines among the conductive patterns of the second cell stack structure STc2 and the channel layer CL. The source select transistors SST, the memory cells MC, and the drain select transistors DST, which are connected in series by the cannel layer CL, form a three-dimensional cell string CSR.

The second multi-layer pattern MLb may include the tunnel insulating layer TI, the data storage layer DL, and the blocking insulating layer BI, which are shown in FIG. 4B.

FIGS. 5A to 5H are sectional views illustrating a manufacturing method of a semiconductor device in accordance with an embodiment of the present disclosure. More specifically, FIGS. 5A to 5H are process sectional views taken along lines I-I' and III-III' shown in FIG. 2.

Figure 5A:
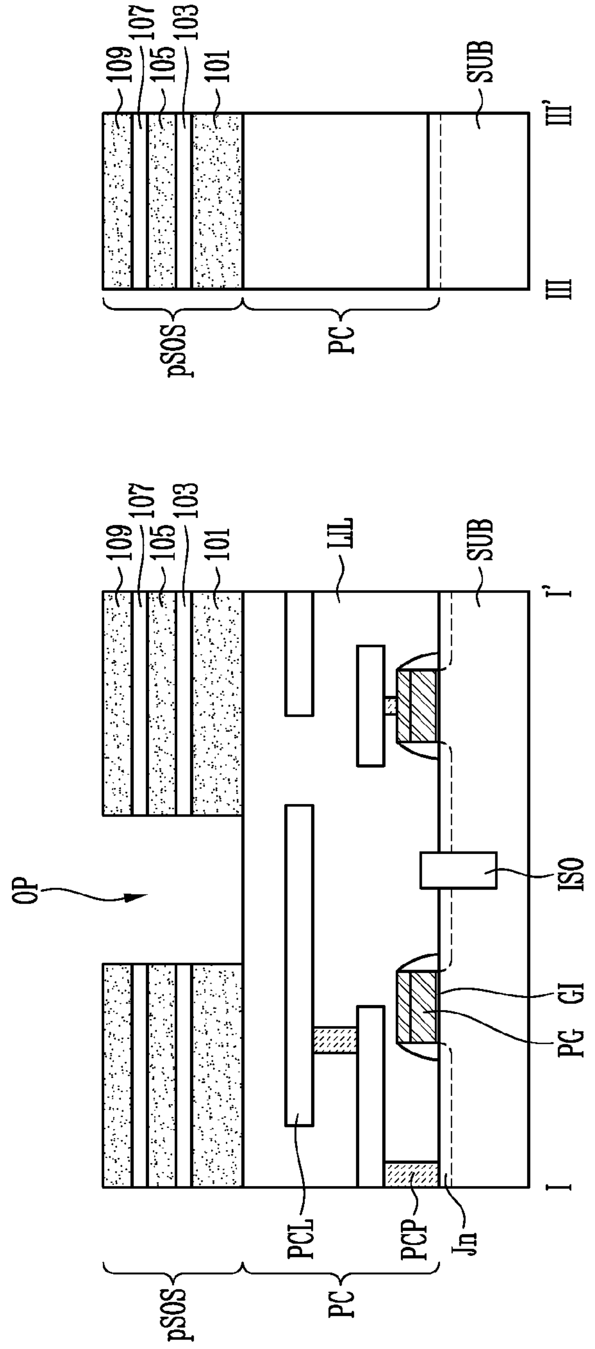
FIGS. 5A to 5H are sectional views illustrating a manufacturing method of a semiconductor device in accordance with an embodiment of the present disclosure.

Referring to FIG. 5A, an isolation layer ISO defining an active region of a substrate SUB may be formed inside the substrate SUB. Subsequently, a gate insulating layer GI, peripheral gate electrodes PG, source and drain junctions in, peripheral circuit lines PCL, lower contact plugs PCP, and a lower insulating layer LIL, which constitute the peripheral circuit structure PC described with reference to FIG. 3, may be formed.

Subsequently, a preliminary source structure pSOS may be formed on the lower insulating layer LIL. The preliminary source structure pSOS may include at least one doped semiconductor layer. In an embodiment, the preliminary source structure pSOS may include a first source layer 101, a source sacrificial layer 105, and a second source layer 109, which are sequentially stacked. The preliminary source structure pSOS may further include a first protective layer 103 disposed between the first source layer 101 and the source sacrificial layer 105 and a second protective layer 107 disposed between the source sacrificial layer 105 and the second source layer 109.

The first source layer 101 and the second source layer 109 may be formed of a doped silicon layer. The first source layer 101 and the second source layer 109 may include an n-type impurity. The first source layer 101 and the second source layer 109 may be formed of an oxide layer. The source sacrificial layer 105 may be formed of an undoped semiconductor layer. For example, the source sacrificial layer 105 may be formed of an undoped silicon layer.

Subsequently, the preliminary source structure pSOS may be etched through an etching process using a mask pattern (not shown) as an etch barrier. Accordingly, an opening OP can be formed, which completely penetrates the preliminary source structure pSOS. The opening OP may expose the lower insulating layer LIL. While an etching process for forming the opening OP is performed, each of the second source layer 109, the source sacrificial layer 105, and the first source layer 101 of the preliminary source structure pSOS may be used as an etch stop layer. Accordingly, during the etching process for forming the opening OP, a phenomenon can be prevented in which conductive patterns (e.g., the peripheral circuit line PCL) of the peripheral circuit structure PC, which are protected by the lower insulating layer LIL, are damaged. The mask pattern may be removed after the opening OP is formed.

Figure 5B:
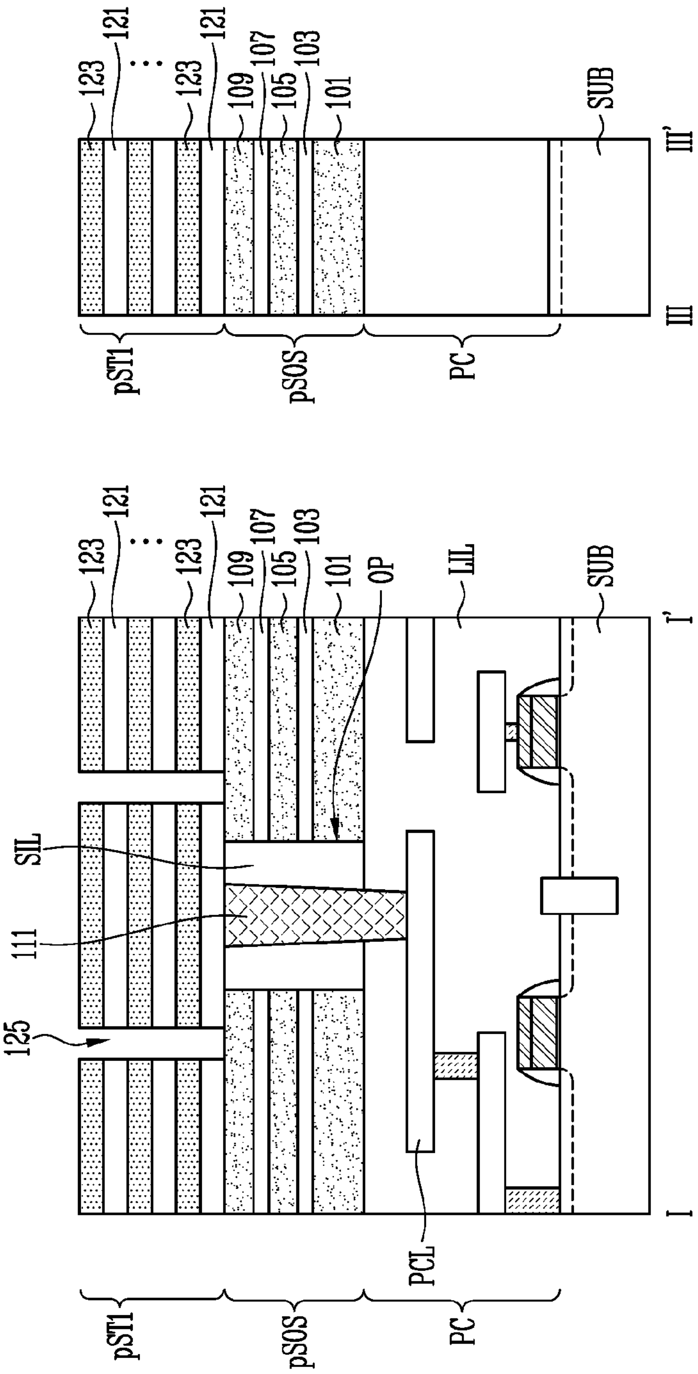

Referring to FIG. 5B, a source insulating layer SIL may be formed, which fills the opening OP. The source insulating layer SIL may be formed of an oxide layer. A surface of the source insulating layer SIL may be planarized such that a top surface of the preliminary source structure pSOS is exposed. A Chemical Mechanical Polishing (CMP) process may be used to planarize the source insulating layer SIL.

Subsequently, a lower contact 111 may be formed, which is connected to the peripheral circuit line PCL of the peripheral circuit structure PC. The lower contact 111 may extend to be connected to the peripheral circuit line PCL while penetrating the source insulating layer SIL.

Subsequently, a first preliminary stack structure pST1 including at least one pair of first and second material layers 121 and 123 may be formed on the preliminary source structure pSOS. The alternately stacked number of the first and second material layers 121 and 123 may be variously changed according to a stacked number of source select lines to be formed. For example, the first preliminary stack structure pST1 may include at least two first material layers 121 and at least two second material layers 123.

Each of the first material layers 121 may be formed of an insulating material for interlayer insulating layers, and each of the second material layers 123 may be formed of an insulating material for sacrificial insulating layers. The second material layers 123 may be formed of a material different from the material of the first material layers 121. More specifically, the second material layers 123 may be formed of a material which can be etched while minimizing etching of the first material layers 121 in a process of selectively etching the second material layers 123. In other words, the second material layers 123 may be formed of a material having a large etch rate difference from the first material layers 121. For example, the first material layers 121 may be formed of an oxide layer, and the second material layers 123 may be formed of a nitride layer. Specifically, the first material layers 121 may be formed of a silicon oxide layer, and the second material layers 123 may be formed of a silicon nitride layer.

Subsequently, a trench 125 may be formed, which penetrates the first preliminary stack structure pST1. The trench 125 may expose an upper portion of the preliminary source structure pSOS while penetrating the first preliminary stack structure pST1.

Figure 5C:
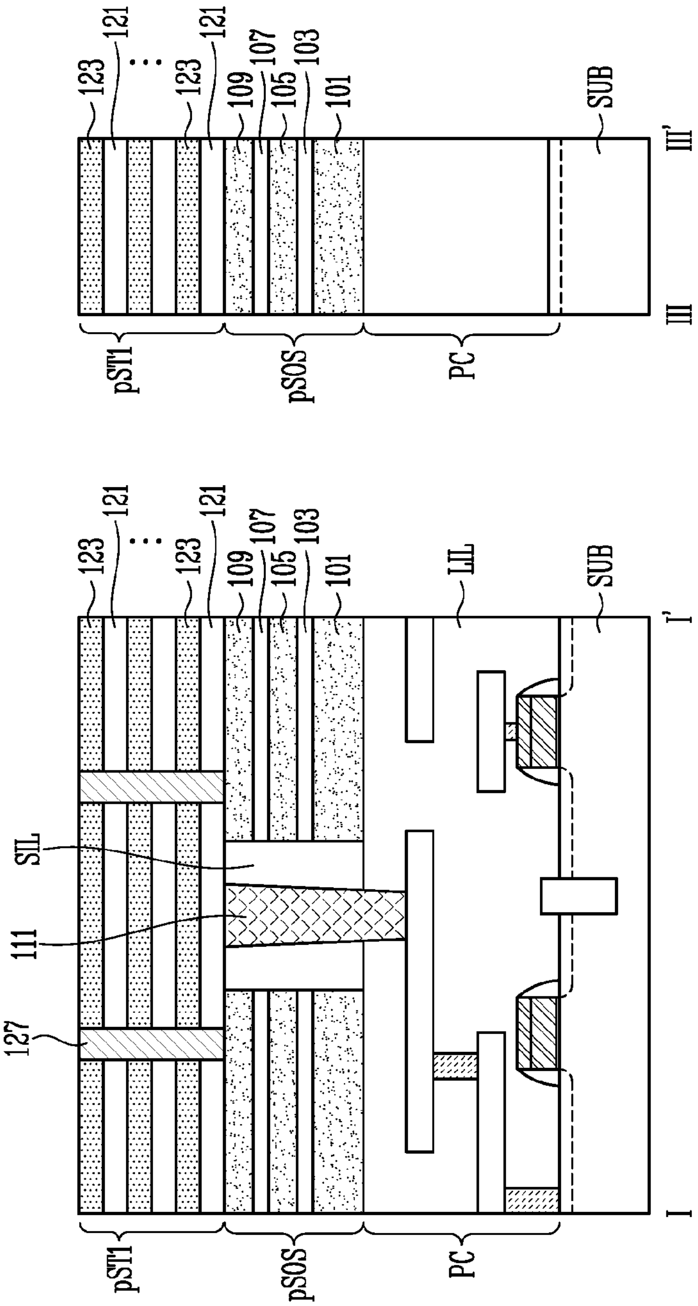

Referring to FIG. 5C, a lower protective pattern 127 may be formed, which fills the trench 125 shown in FIG. 5B. The lower protective pattern 127 may be formed of an insulating material. For example, the lower protective pattern 127 may be formed of an oxide or a nitride.

Figure 5D:
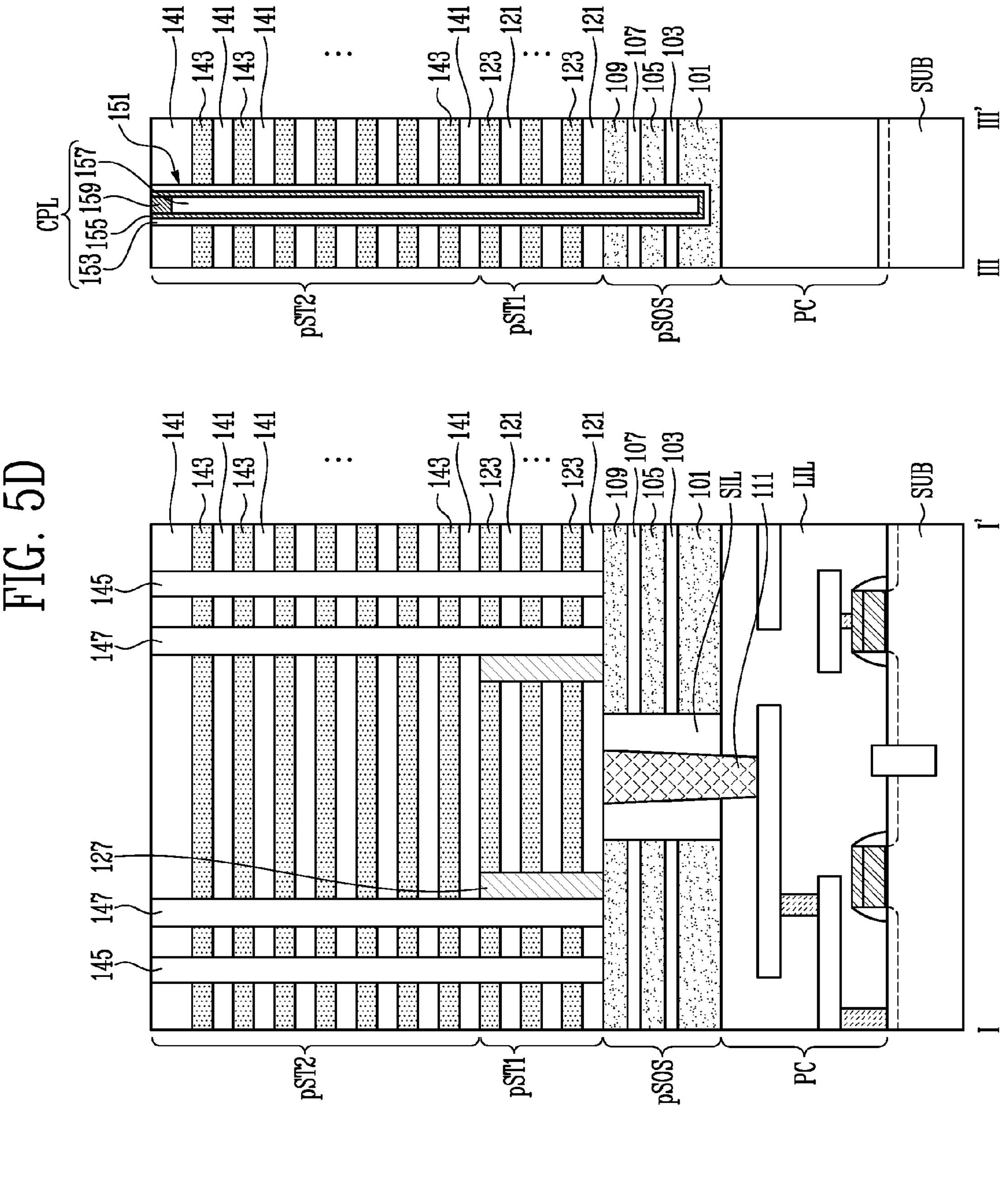

Referring to FIG. 5D, a second preliminary stack structure pST2 in which third material layers 141 and fourth material layers 143 are alternately stacked may be formed on the source insulating layer SIL and the first preliminary stack structure pST1.

The third material layers 141 may be formed of the same material as the first material layers 121 described with reference to FIG. 5A, and the fourth material layers 143 may be formed of the same material as the second material layers 123 described with reference to FIG. 5A. For example, the third material layers 141 may be formed of an oxide layer, and the fourth material layers 143 may be formed of a nitride layer. Specifically, the third material layers 141 may be formed of a silicon oxide layer, and the fourth material layers 143 may be formed of a silicon nitride layer.

Subsequently, supports 145 and vertical barriers 147 may be formed, which penetrate the second preliminary stack structure pST2 and the first preliminary stack structure pST1. In addition, cell plugs CPL may be formed, which penetrate the second preliminary stack structure pST2 and the first preliminary stack structure pST1. The cell plugs CPL may extend to the inside the first source layer 101 while further penetrating the second source layer 109, the second protective layer 107, the source sacrificial layer 105, and the first protective layer 103.

The supports 145 and the vertical barriers 147 may extend to penetrate the second preliminary stack structure pST2 and to penetrate the first preliminary stack structure pST1 as described with reference to FIG. 3. When the supports 145 and the vertical barriers 147 are configured as dummy cell plugs, the dummy cell plugs may be simultaneously formed with the cell plugs CPL.

Each of the cell plugs CPL may be formed inside a channel hole 151 penetrating the first preliminary stack structure pST1 and the second preliminary stack structure pST2. The channel hole 151 may extend to the inside of the first source layer 101 while further penetrating the second source layer 109, the second protective layer 107, the source sacrificial layer 105, and the first protective layer 103. The process of forming the cell plugs CPL may include a process of performing an etching process for forming the channel hole 151, a process of forming a multi-layer 153, and a process of forming a channel layer 155 on the multi-layer 153.

The multi-layer 153 may include a blocking insulating layer, a data storage layer, and a tunnel insulating layer as described with reference to FIG. 4B. The channel layer 155 may be formed of a semiconductor layer. The channel layer 155 may be formed to completely fill a central region of the channel hole 151. Alternatively, the channel layer 155 may be conformally formed on the multi-layer 153, and the central region of the channel hole 151 might not be completely filled with the channel layer 155. A core insulating layer 157 and a capping pattern 159, which fill the central region of the channel hole 151, may be formed on the channel layer 155. The capping pattern 159 may fill the central region of the channel hole 151 on the core insulating layer 157.

Figure 5E:
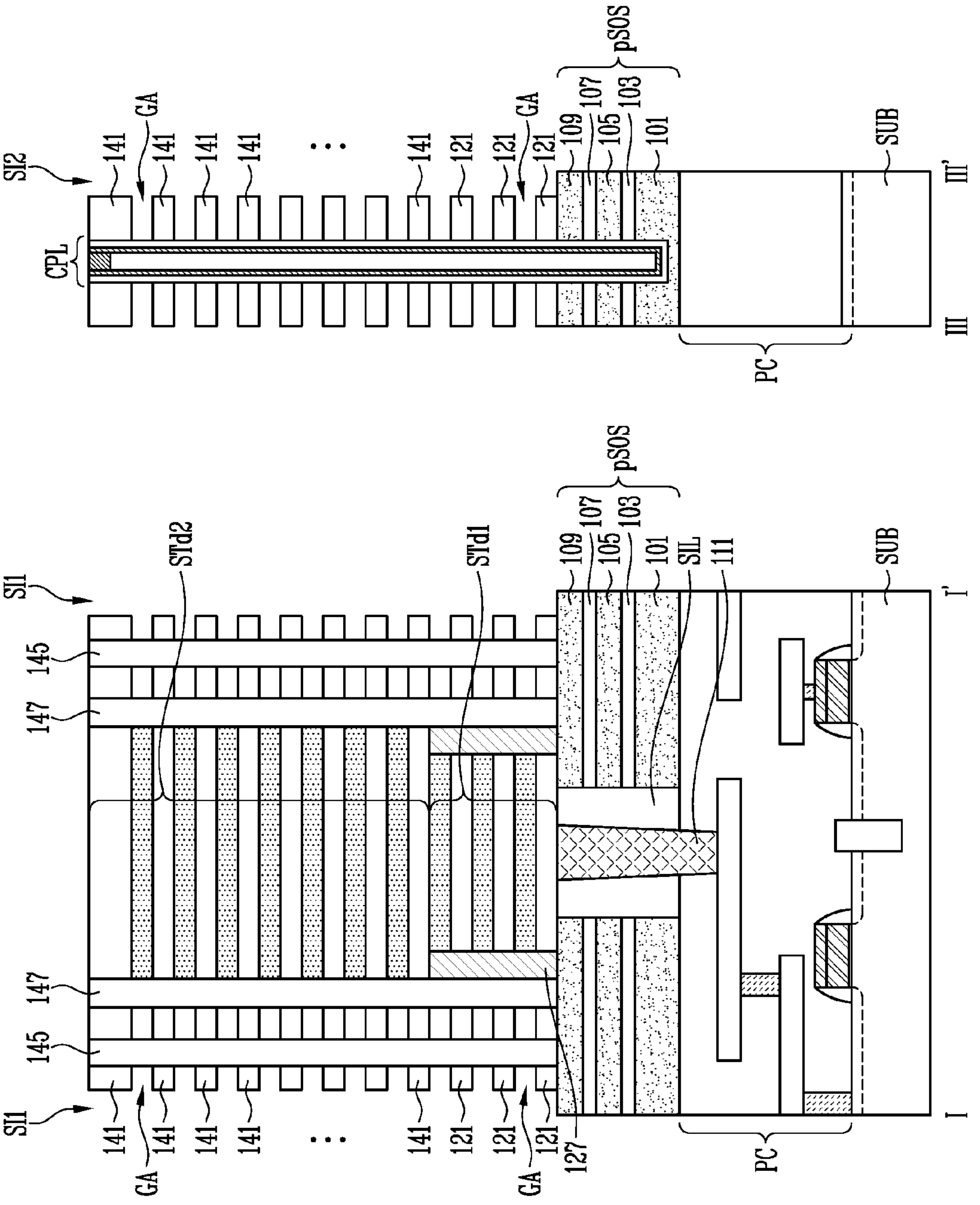

Referring to FIG. 5E, first slits SI1 and a second slit SI2 may be formed, which penetrate the first preliminary stack structure pST1 and the second preliminary stack structure pST2, which are shown in FIG. 5D. A layout of the first slits SI1 and the second slit SI2 is the same as described with reference to FIG. 2.

The first slits SI1 and the second slit SI2 do not overlap with the opening OP as described with reference to FIG. 2. Accordingly, because the whole of each of the first slits SI1 and the second slit SI2 can overlap with the preliminary source structure pSOS, the preliminary source structure pSOS may be used as an etch stop layer when an etching process for forming the first slits SI1 and the second slit SI2 is performed. In particular, the second source layer 109 of the preliminary source structure pSOS may be used as an etch stop layer. Accordingly, a phenomenon can be prevented in which the peripheral circuit structure PC including the peripheral circuit line PCL is damaged due to influence of the etching process for forming the first slits SI1 and the second slit SI2, which are formed to a deep depth.

Subsequently, the second material layers 123 of the first preliminary stack structure pST1 and the fourth material layers 143 of the second preliminary stack structure pST2, which are shown in FIG. 5D, may be selectively removed through the first slits SI1 and the second slit SI2. Regions in which the second material layers and the fourth material layers are removed are defined as gate regions GA. The gate regions GA may be formed to expose the cell plugs CPL. Referring to FIG. 5D, an etching process for forming the gate regions GA may be controlled such that the second material layers 123 of the first preliminary stack structure pST1 and the fourth material layers 143 of the second preliminary stack structure pST2 can remain as dummy layers. The second material layers 123 and the fourth material layers 143, which remain as the dummy layers, constitute the dummy stack structure STd described with reference to FIG. 3.

The supports 145 and the vertical barriers 147 may support such that the first material layers 121 and the third material layers 141 do not collapse but can be maintained even when the gate regions GA are formed. During the etching process for forming the gate regions GA, the supports 145 and the vertical barriers 147 may block an etching material introduced from the first slits SI1 from being introduced into the dummy stack structure STd.

The supports 145 and the vertical barriers 147, which are described above, are formed in various forms, to support the first material layers 121 and the third material layers 141. Also, the supports 145 and the vertical barriers 147 may block an etching material from being introduced into the dummy stack structure STd.

The lower protective pattern 127 may block an etching material from being introduced into the dummy stack structure STd even when the vertical barrier 147 does not penetrate a lowermost sacrificial insulating layer of the first dummy stack structure STd1.

Figure 5F:
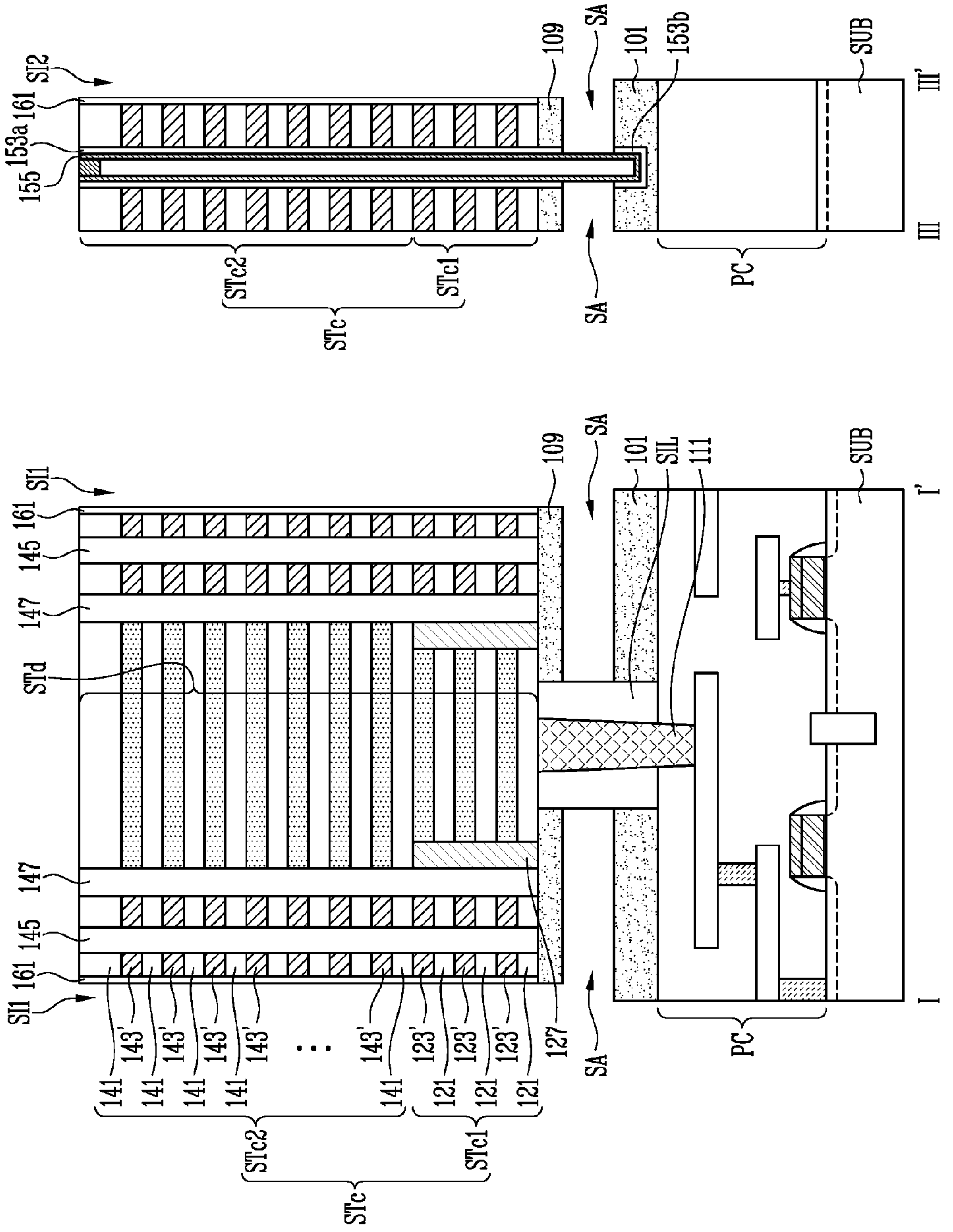

Referring to FIG. 5F, the gate regions GA shown in FIG. 5E is filled with conductive patterns 123' and 143'. Accordingly, as described with reference to FIG. 3, a first cell stack structure STc1 and a second cell stack structure STc2, which include the conductive patterns 123' and 143, may be formed.

The process of forming the conductive patterns 123' and 143' may include a process of forming a conductive material to fill the gate regions GA and a process of removing a portion of the conductive material inside the first and second slits SI1 and SI2 such that the conductive material is isolated into the conductive patterns 123' and 143'.

Each of the conductive patterns 123' and 143' may include at least one of a doped silicon layer, a metal silicide layer, and a metal layer. A low resistance metal such as tungsten may be used as each of the conductive patterns 123' and 143' to achieve low resistance wiring. Each of the conductive patterns 123' and 143' may include a barrier layer such as a titanium nitride layer, a tungsten nitride layer, or a tantalum nitride layer.

Subsequently, a sidewall insulating layer 161 may be formed on a sidewall of each of the first and second slits SI1 and SI2. After that, the source sacrificial layer 105 is exposed by etching the second source layer exposed through the first and second slits SI1 and SI2. After that, the exposed source sacrificial layer 105 is removed. In different embodiments, the first protective layer 103 and/or the second protective layer 107 shown in FIG. 5E are/is also removed. A region from which the source sacrificial layer 105 is removed is defined as a source region SA.

Subsequently, the multi-layer exposed through the source region SA may be etched, thereby isolating the multi-layer into a first multi-layer pattern 153*a* and a second multi-layer pattern 153*b*. A portion of a sidewall of the channel layer 155 is exposed between the first multi-layer pattern 153*a* and the second multi-layer pattern 153*b*. During the process of forming the source region SA and the process of etching the multi-layer, the first and second protective layers 103 and 107 may be removed. Accordingly, a bottom surface of the second source layer 109 and a top surface of the first source layer 101, which face the source region SA, may be exposed.

Figure 5G:
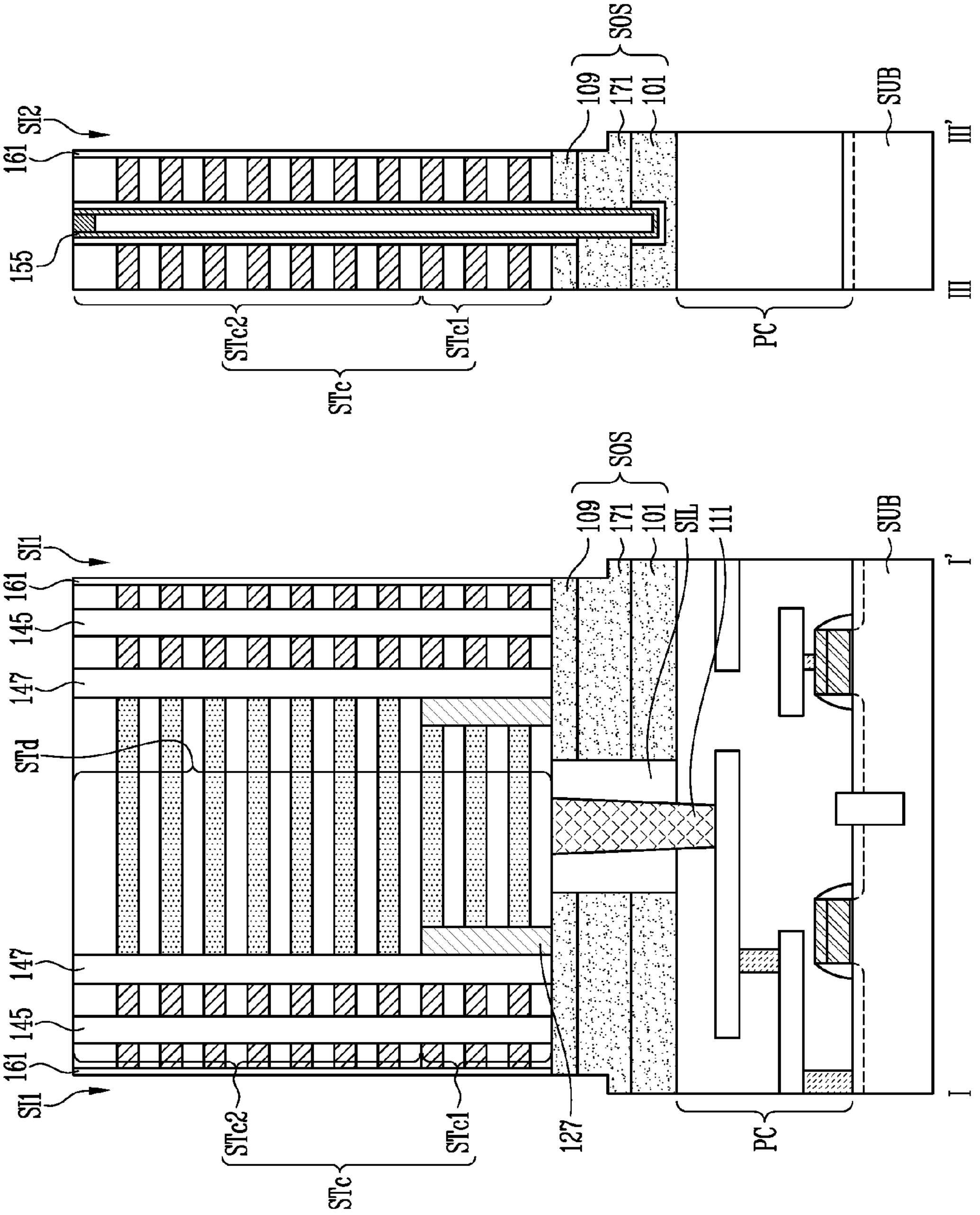

Referring to FIG. 5G, a channel connection layer 171 is formed inside the source region SA shown in FIG. 5F. The channel connection layer 171 may be in contact with the channel layer 155, the first source layer 101, and the second source layer 109. The channel connection layer 171 may be formed through a chemical vapor deposition process or a growth process using, as a seed layer, the channel layer 155, the first source layer 101, and the second source layer 109. The first source layer 101, the channel connection layer 171, and the second source layer 109 are defined as a source structure SOS.

Figure 5H:
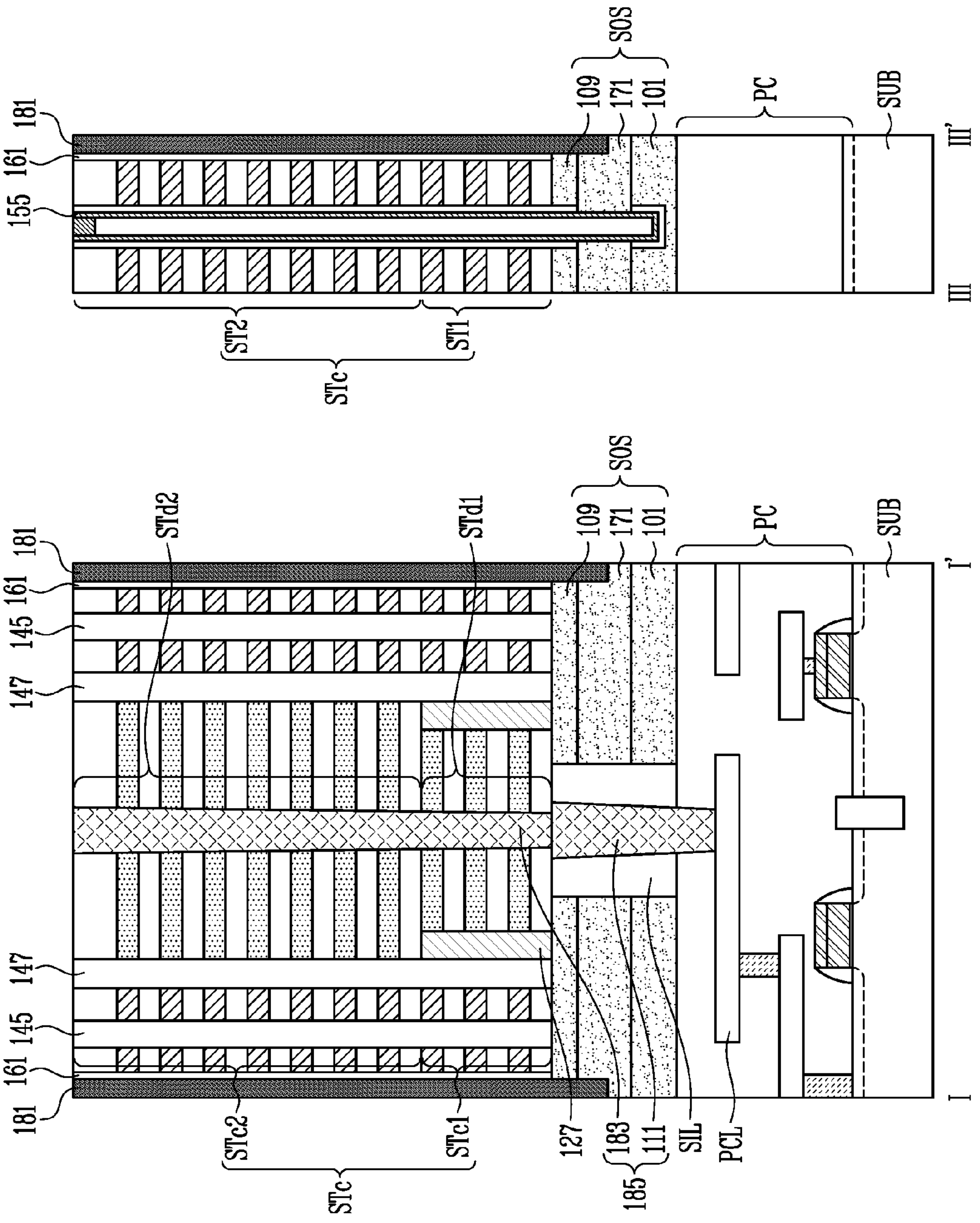

Referring to FIG. 5H, a source contact structure 181 may be formed, which fills each of the first slits SI1 and the second slit SI2. The source contact structure 181 may be formed on the sidewall insulating layer 161, and may be in contact with the source structure SOS.

After that, an upper contact 183 connected to the lower contact 111 may be formed. The upper contact 183 and the lower contact 111 are defined as a peripheral contact plug 185.

The peripheral contact plug 185 may be connected to the peripheral circuit line PCL of the peripheral circuit structure PC. The peripheral contact plug 185 may extend to be connected to the peripheral circuit line PCL while penetrating the dummy stack structure STd on the source insulating layer SIL and penetrating the source insulating layer SIL. The dummy stack structure STd is formed as a stack structure in which interlayer insulating layers and sacrificial layers are alternately stacked.

Figure 6:
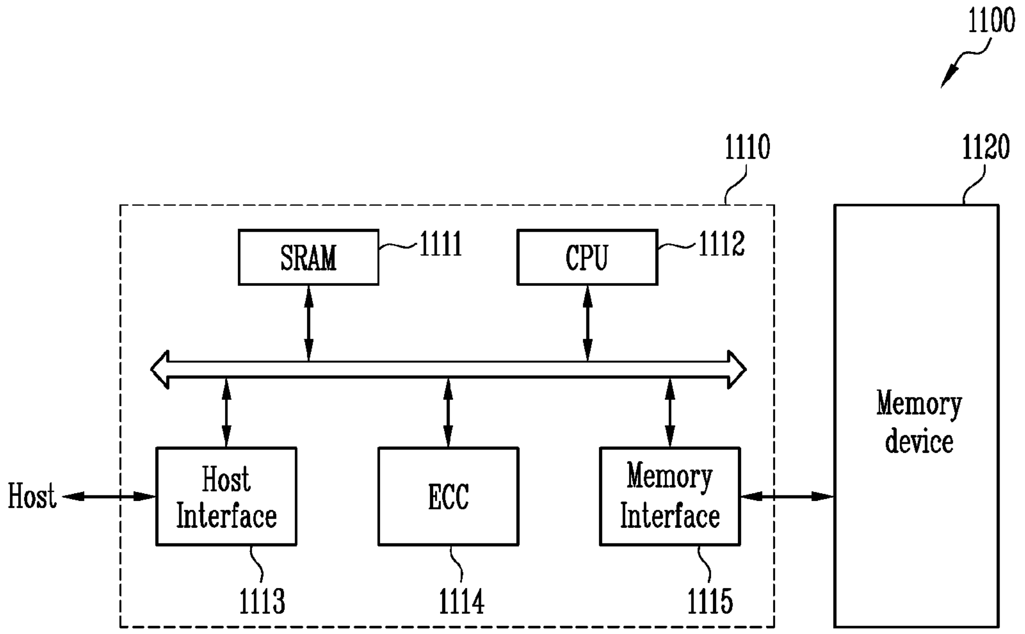
FIG. 6 is a block diagram illustrating a configuration of a memory system in accordance with an embodiment of the present disclosure.

FIG. 6 is a block diagram illustrating a configuration of a memory system 1100 in accordance with an embodiment of the present disclosure.

Referring to FIG. 6, the memory system 1100 includes a memory device 1120 and a memory controller 1110.

The memory device 1120 may be a multi-chip package configured with a plurality of flash memory chips. The memory device 1120 may be a nonvolatile memory device. Also, the memory device 1120 may have the structure described above with reference to FIGS. 2 to 4B, and may be manufactured according to the manufacturing method described above with reference to FIGS. 5A to 5H. In an embodiment, the memory device 1120 may include a substrate, a source structure disposed on the substrate, cell stack structures disposed on the source structure, a dummy stack structure disposed between the cell stack structure on the source structure, vertical barriers disposed between the dummy stack structure and the cell stack structures, and a lower protective pattern disposed at a lower portion of the dummy stack structure between the vertical barriers. The structure of the memory device 1120 is the same as described above, and therefore, its detailed description is not repeated here.

The memory controller 1110 controls the memory device 1120, and may include Static Random Access Memory (SRAM) 1111, a Central Processing Unit (CPU) 1112, a host interface 1113, an error correction block (ECC) 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The error correction block 1114 detects errors included in a data read from the memory device 1120, and corrects the detected errors. The memory interface 1115 interfaces with the memory device 1120. The memory controller 1110 may further include Read Only Memory (ROM) for storing code data for interfacing with the host, and the like.

The memory system 1100 configured as described above may be a memory card or a Solid State Disk (SSD), in which the memory device 1120 is combined with the memory controller 1110. For example, when the memory system 1100 is an SSD, the memory controller 1110 may communicate with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 7:
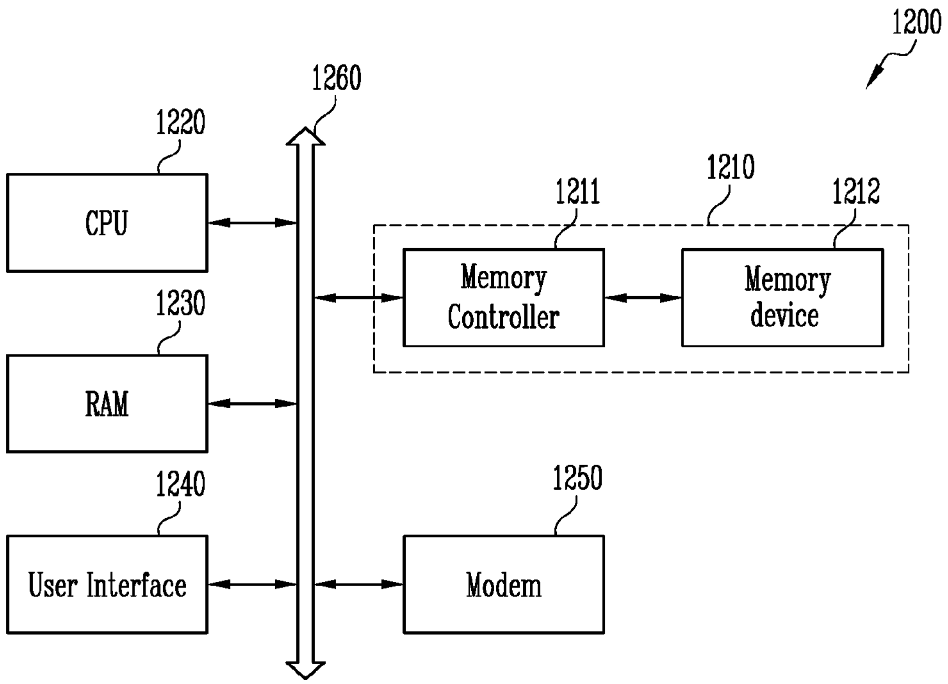
FIG. 7 is a block diagram illustrating a configuration of a computing system in accordance with an embodiment of the present disclosure.

FIG. 7 is a block diagram illustrating a configuration of a computing system 1200 in accordance with an embodiment of the present disclosure.

Referring to FIG. 7, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, mobile D-RAM, and the like may be further included.

The memory system 1210 may be configured with a memory device 1212 and a memory controller 1211.

The memory controller 1211 may be configured identically to the memory controller 1110 described above with reference to FIG. 6.

In accordance with the present disclosure, a lower protective pattern is inserted into a dummy stack structure, thereby improving operational reliability.

While the present disclosure has been shown and described with reference to certain embodiments, it will be understood by those skilled in the art that various changes in form and detail may be made therein without departing from the spirit and scope of the present disclosure as defined by the appended claims and their equivalents. Therefore, the scope of the present disclosure should not be limited to only the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
- a substrate;
- a source structure disposed on the substrate;
- cell stack structures disposed on the source structure;
- a dummy stack structure disposed between the cell stack structures on the source structure;
- vertical barriers disposed between the dummy stack structure and the cell stack structures; and
- at least one lower protective pattern disposed at a lower portion of the dummy stack structure between the vertical barriers,
- wherein the dummy stack structure includes a first stack structure and a second stack structure on the first stack structure, and
- wherein the at least one lower protective pattern is disposed at the same level as the first stack structure.

2. The semiconductor device of claim 1, further comprising:
- an opening penetrating the source structure;
- a source insulating layer disposed in the opening; and
- a peripheral contact plug comprising an upper portion penetrating through the dummy stack structure disposed on the top of the source insulating layer.

3. The semiconductor device of claim 2,
- wherein the peripheral contact plug comprises a lower portion extending from the upper portion and penetrating through the source insulating layer disposed in the opening.

4. The semiconductor device of claim 3, further comprising a peripheral circuit structure disposed between the substrate and the source structure,
- wherein the lower portion of the peripheral contact plug is connected to the peripheral circuit structure.

5. The semiconductor device of claim 3,
- wherein the lower portion of the peripheral contact plug is spaced apart from the source structure by the source insulating layer disposed in the opening.

6. The semiconductor device of claim 2,
- wherein the peripheral contact plug is disposed between two of the at least one lower protective pattern.

7. The semiconductor device of claim 1,
- wherein the dummy stack structure includes dummy interlayer insulating layers and sacrificial insulating layers, which are alternately stacked, wherein the cell stack structures include interlayer insulating layers and conductive patterns, which are alternately stacked, and wherein the dummy stack structure is isolated from the cell stack structures by the vertical barriers.

8. The semiconductor device of claim 7, wherein the dummy stack structure includes a first stack structure and a second stack structure on the first stack structure, wherein the first stack structure includes a lowermost sacrificial insulating layer of the dummy stack structure, and wherein the at least one lower protective pattern penetrates the lowermost sacrificial insulating layer of the dummy stack structure.

9. The semiconductor device of claim 1, further comprising a support penetrating through a cell stack structure of the cell stack structures to contact a top of the source structure.

* * * * *